US012581990B2

(12) United States Patent
Lachmann et al.

(10) Patent No.: US 12,581,990 B2
(45) Date of Patent: Mar. 17, 2026

(54) METAL TAB FOR POWER SEMICONDUCTOR MODULE

(71) Applicant: Littelfuse, Inc., Chicago, IL (US)

(72) Inventors: Thomas Lachmann, Lampertheim (DE); Thomas Spann, Furth (DE)

(73) Assignee: Littelfuse, Inc., Rosemont, IL (US)

( * ) Notice: Subject to any disclaimer, the term of this patent is extended or adjusted under 35 U.S.C. 154(b) by 358 days.

(21) Appl. No.: 18/233,403

(22) Filed: Aug. 14, 2023

(65) Prior Publication Data

US 2025/0062270 A1 Feb. 20, 2025

(51) Int. Cl.
*H01L 23/00* (2006.01)
*H01L 23/31* (2006.01)

(52) U.S. Cl.
CPC .......... *H01L 24/40* (2013.01); *H01L 23/3107* (2013.01); *H01L 2224/4001* (2013.01); *H01L 2224/40091* (2013.01); *H01L 2224/40225* (2013.01); *H01L 2924/2076* (2013.01)

(58) Field of Classification Search
CPC ................................ H01L 24/26; H01L 24/40
See application file for complete search history.

(56) References Cited

U.S. PATENT DOCUMENTS 5,529,509 A 6/1996 Hayes
6,396,127 B1 5/2002 Munoz 7,095,113 B2 * 8/2006 Xiaochun ............... H01L 24/40
361/615
7,160,157 B1 * 1/2007 Jones, III ............... H01R 11/01
439/288
2006/0214290 A1 9/2006 Xiaochun
2017/0250125 A1 8/2017 Arokiasamy
2020/0350272 A1 11/2020 Hong
2021/0343627 A1 * 11/2021 Yandoc ............ H01L 23/49575

OTHER PUBLICATIONS

International Search Report and Written Opinion for International Application No. PCT/US2024/042016, mailed on Oct. 4, 2024, 11 pages.

* cited by examiner

*Primary Examiner* — Yu-Hsi D Sun
(74) *Attorney, Agent, or Firm* — KDW Firm PLLC

(57) ABSTRACT

A connector for contacting a semiconductor chip. The connector may include a tab, where the tab includes an outer portion, having a planar shape, the outer portion having a lower surface, adapted to contact a surface of the semiconductor chip, and an upper surface that defines a main plane of the tab. The tab may also include a ring portion, the ring portion connected to the outer portion and extending proud of the main plane, wherein the ring portion defines an inner hole within the tab structure, the inner hole being adapted to expose a contact portion of the surface of the semiconductor chip, wherein the ring portion includes at least two slots. The connector may further include a clip, comprising a connection portion, the connection portion having an aperture that is adapted to couple around the ring portion.

16 Claims, 7 Drawing Sheets

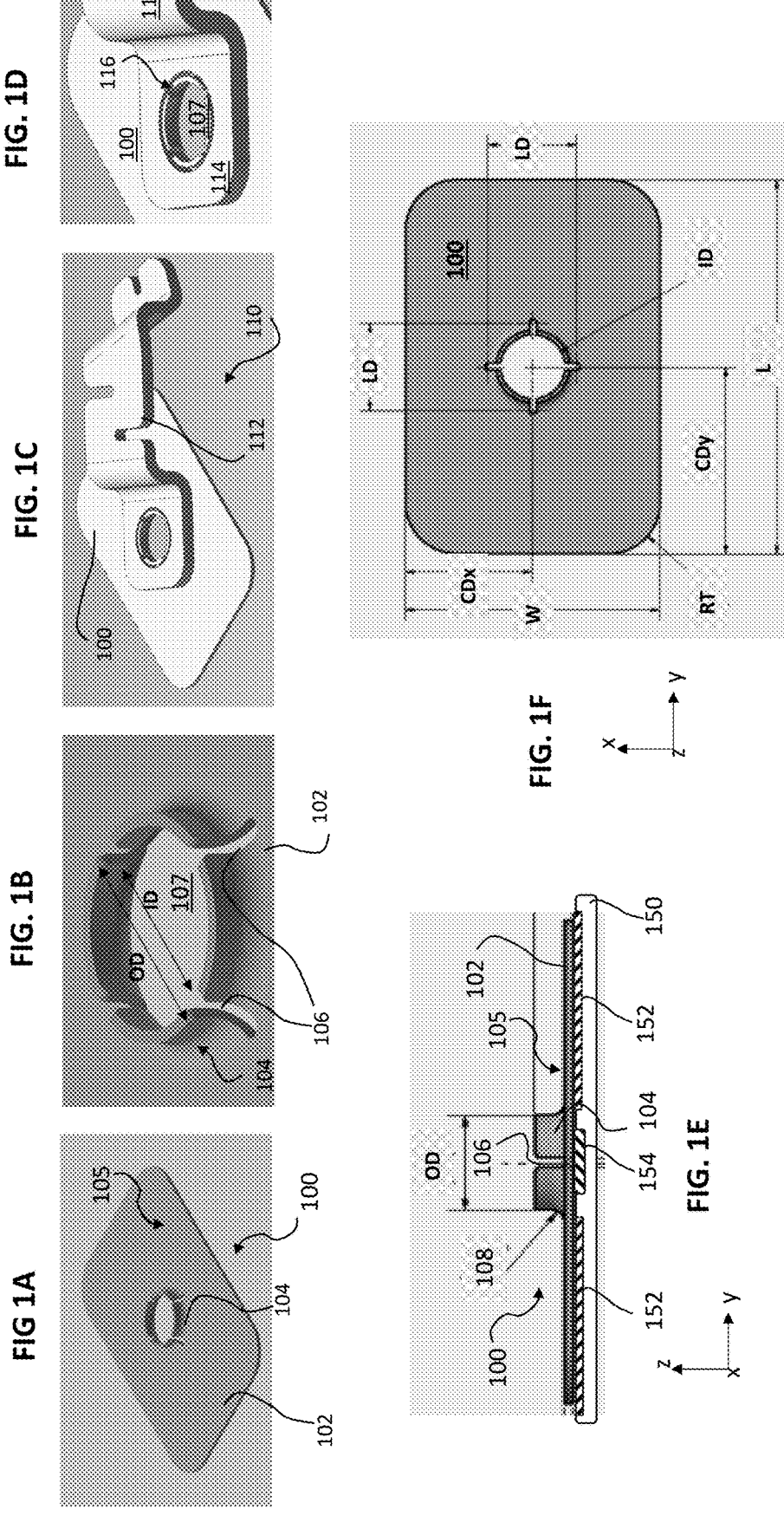

Figures 5A, 5B, 6:
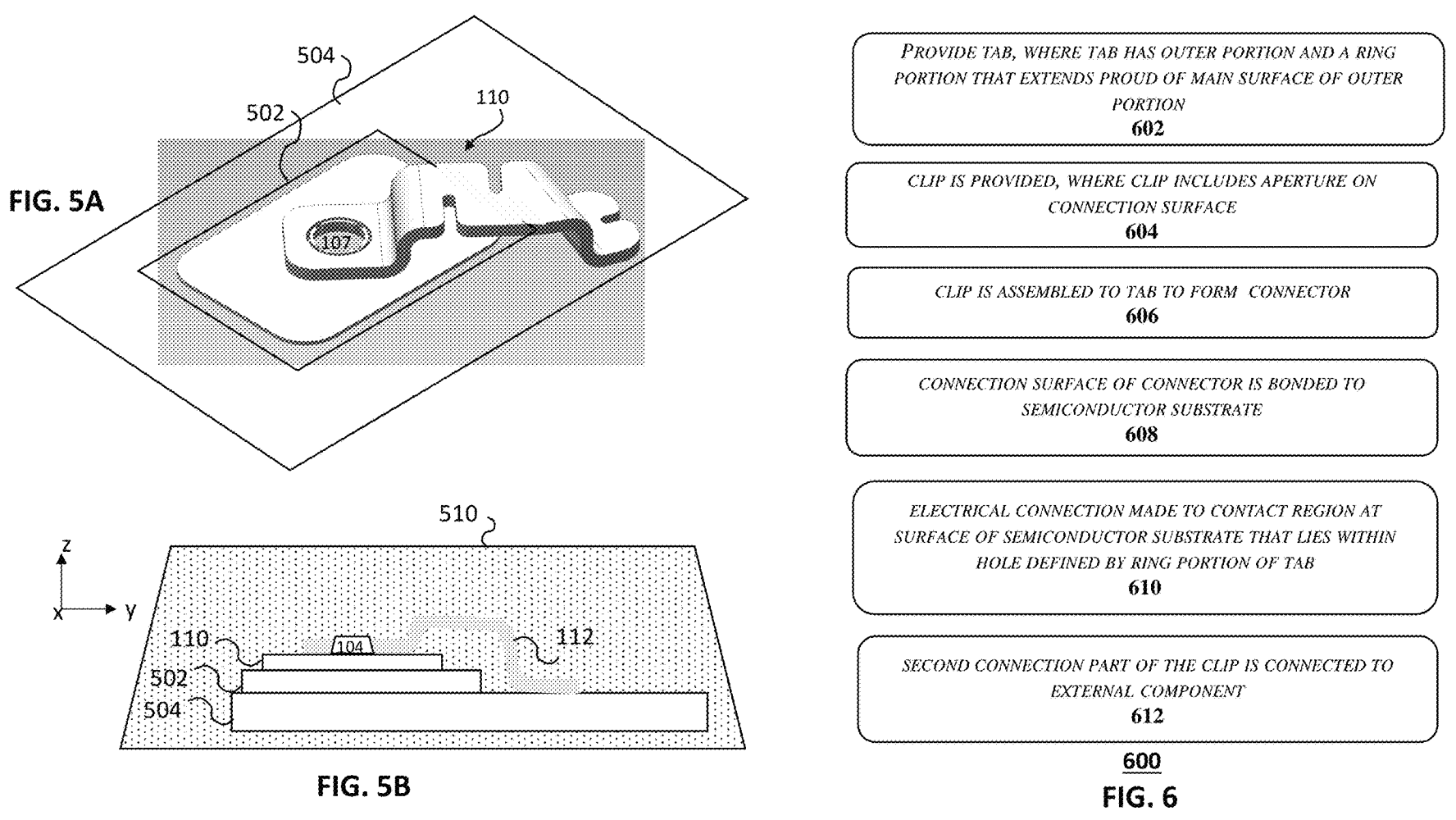

PROVIDE TAB, WHERE TAB HAS OUTER PORTION AND A RING PORTION THAT EXTENDS PROUD OF MAIN SURFACE OF OUTER PORTION
602

CLIP IS PROVIDED, WHERE CLIP INCLUDES APERTURE ON CONNECTION SURFACE
604

CLIP IS ASSEMBLED TO TAB TO FORM CONNECTOR
606

CONNECTION SURFACE OF CONNECTOR IS BONDED TO SEMICONDUCTOR SUBSTRATE
608

ELECTRICAL CONNECTION MADE TO CONTACT REGION AT SURFACE OF SEMICONDUCTOR SUBSTRATE THAT LIES WITHIN HOLE DEFINED BY RING PORTION OF TAB
610

SECOND CONNECTION PART OF THE CLIP IS CONNECTED TO EXTERNAL COMPONENT
612

METAL TAB FOR POWER SEMICONDUCTOR MODULE

BACKGROUND

Field

Embodiments relate to the field of semiconductor devices, and in particular, packages for powering semiconductor chips.

Discussion of Related Art

Power semiconductor modules based upon an insulating substrate (e.g. direct bonded copper (DBC), directed bonded aluminum (DBA), AMB) are known. Such substrates may generally be formed as a sandwich structure with an inner insulating substrate such as alumina or aluminum nitride, and a layer of copper or aluminum on opposite main surfaces of the inner insulating substrate. These power semiconductor modules include a housing, attached to the substrate by glue or other material, while semiconductor chips are attached to the substrate, by soldering, sintering, or other method. These semiconductor chips may include Si, SiC, GaN or other semiconductor materials, and may be employed as diodes, silicon-controlled rectifier (SCR), insulated gate bipolar transistors (IGBT), or metal oxide semiconductor field effect transistors (MOSFETS), as an example. An SCR gate contact may be placed in a center or corner position of the semiconductor chip, as well as an IGBT or MOSFET contact. The gate contact may be wire bonded, soldered or sintered, for example. In these power semiconductor modules, power and auxiliary terminals are generally attached to the substrate, by soldering or sintering, for example. A dielectric material may be placed inside the housing, such as silicone gel, polyurethane gel, or epoxy. In some approaches, a dielectric gel is formed as a composite gel with a filler material, to increase moisture resistance. Moisture can penetrate the power semiconductor module and has the potential to increase the leakage current with a resultant blocking voltage degradation. The substrate is provided with a circuitry structure to assure the electric function of the module. The semiconductor chips are generally connected to the substrate and/or other semiconductor chips by e.g., wires or clips.

The die-to-substrate and/or die-to-die connections have to fulfill the following main functions: a) electrical and thermal conductivity. In known power semiconductor modules, wires made of Al, Cu, or a combination of Al/Cu are wire bonded. Clips may be made of Cu or Cu alloy, soldered or sintered. Clip/tab combinations may be made of Cu or Cu alloy, molybdenum or Cu/Fe alloy/Cu sandwich systems, where these components are soldered or sintered. Some variants of these components may have a Ni finish to protect the quality of the tab and the chip and circuitry. In known power semiconductor modules tabs are normally flat, adapted to the semiconductor chip. In known approaches, some tabs may have protrusions to assure a minimum thickness of solder alloy between tab and chip. In known approaches, some tabs have a hole, such as a center hole, which may be provided to make the gate contact in case of thyristor (SCR) usage where the contact to the gate is provided in the center of the semiconductor die (chip). The clip or clip/tab design may be adapted to the chip design, to reach a high power transfer and high surge current. One objective is to maximize the interface area, to assure high electrical and thermal transfer/conductivity.

One issue with the aforementioned known power semiconductor modules is that in modules based upon tabs with center holes the proper aligning of the tabs with the clips may be challenging. Moreover, dielectric materials having a filler content have a more rubber-like consistency, which material is in contact with the center gate connection. Due to the rubber-like mechanics, the dielectric material has the potential to reduce the long time reliability of the gate wire bond.

In view of the above, the present embodiments are provided.

BRIEF SUMMARY

In one embodiment a connector for contacting a semiconductor chip is provided. The connector may include a tab, where the tab includes an outer portion, having a planar shape, the outer portion having a lower surface, adapted to contact a surface of the semiconductor chip, and an upper surface that defines a main plane of the tab. The tab may also include a ring portion, the ring portion connected to the outer portion and extending proud of the main plane, wherein the ring portion defines an inner hole within the tab structure, the inner hole being adapted to expose a contact portion of the surface of the semiconductor die, wherein the ring portion includes at least two slots. The connector may further include a clip, comprising a connection portion, the connection portion having an aperture that is adapted to couple around the ring portion.

In another embodiment, a semiconductor device module is provided. The semiconductor device module may include a housing, comprising a filler material, a substrate, comprising an insulating material, disposed within the housing, and a semiconductor chip, disposed within the housing and disposed on the substrate, the semiconductor chip having an upper surface. The semiconductor device module may also include a connector, affixed to the semiconductor chip, wherein the connector structure comprises a tab and a clip. The tab may include an outer portion, having a planar shape, the outer portion having a lower surface, affixed in contact with the upper surface of the semiconductor chip, the outer portion having an upper surface that defines a main plane of the tab structure. The tab may further include a ring portion, the ring portion connected to the outer portion and extending proud of the main plane, wherein the ring portion defines an inner hole within the tab, wherein a contact portion of the surface of the semiconductor chip is exposed within the inner hole, wherein the ring portion includes at least two slots. The clip may include a connection portion, the connection portion having an aperture that is affixed around the ring portion.

In another embodiment, a metal tab for connecting to a semiconductor chip is provided. The metal tab may include an outer portion, having a planar shape, the outer portion having a lower surface, adapted to contact a surface of the semiconductor chip, and an upper surface that defines a main plane of the metal tab. The metal tab may include a ring portion, the ring portion connected to the outer portion and extending proud of the main plane, wherein the ring portion defines an inner hole within the tab structure, the inner hole being adapted to expose a contact portion of the surface of the semiconductor chip. The ring portion may include at least two slots that extend downwardly from a top of the ring portion toward the outer portion.

BRIEF DESCRIPTION OF THE DRAWINGS

FIG. 1A-1F illustrate various views of a tab structure and connector according to embodiments of the present disclosure;

FIG. 3A-3D shows various views of a tab structure and connector according to still further embodiments of the present disclosure;

FIG. 5A shows a perspective view of one implementation of a connector according to embodiments of the disclosure;

FIG. 5B shows a cross-sectional view of a semiconductor device module, arranged according to embodiments of the disclosure;

FIG. 6 depicts a process flow, according to embodiments of the disclosure.

DESCRIPTION OF EMBODIMENTS

Figures 1G, 1H, 1I, 1J, 1K, 1L:
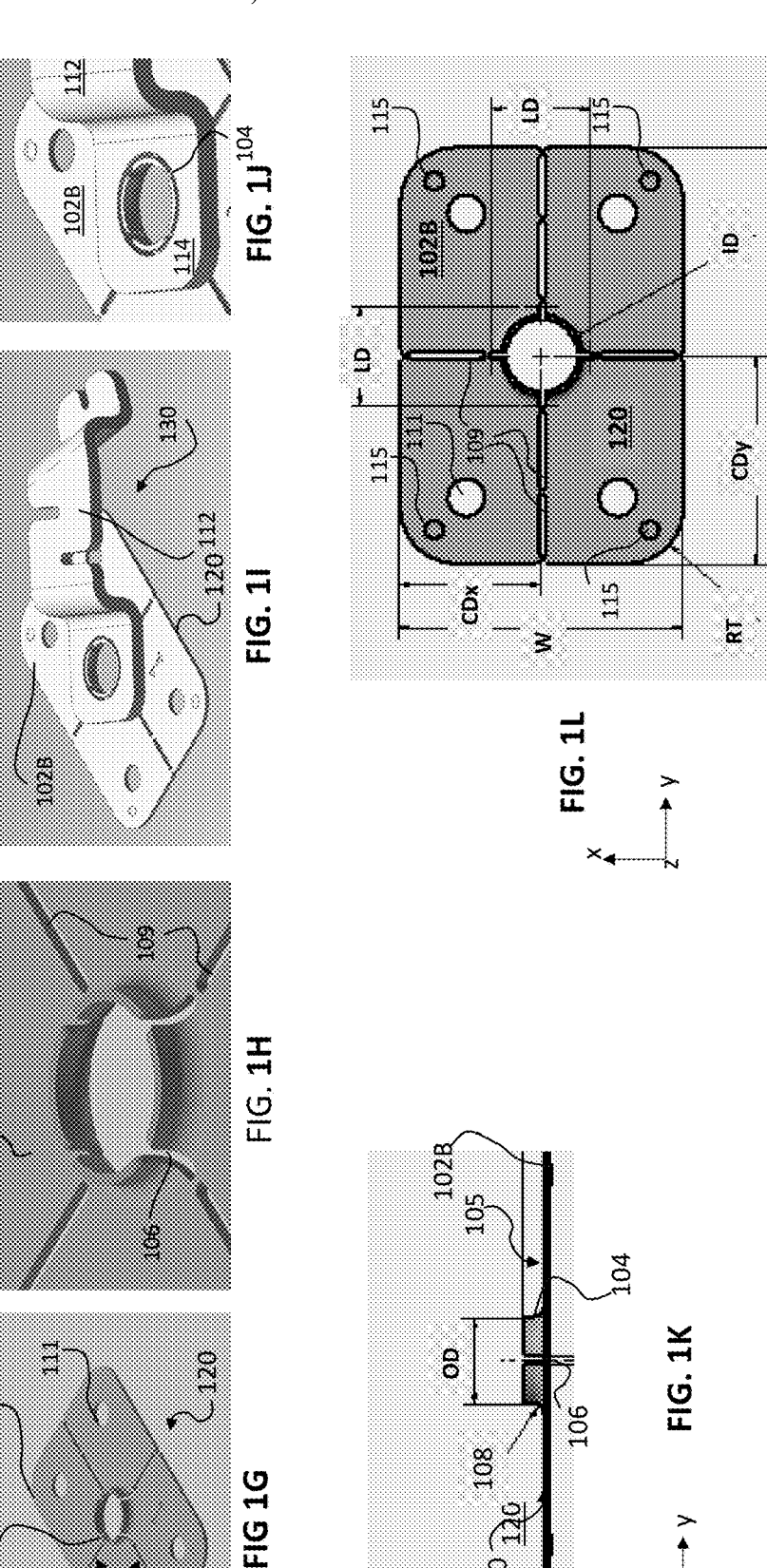
FIG. 1G-1L illustrate various views of another tab structure and connector according to embodiments of the present disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a semiconductor device package, a clip/tab connecting structure, and a tab structure for a semiconductor device package are provided. In accordance with various embodiments, a tab is provided with a ring structure with following properties, as disclosed in the description to follow.

A tab for contacting a semiconductor chip (also referred to herein as a semiconductor die or semiconductor substrate)

according to the present embodiments is provided with a raised ring structure that extends proud of the surface of a flat, planar portion of the tab. The raised ring structure may thus be able to keep a gate contact of the semiconductor chip free of rubber-like gel that is provided in a semiconductor device module. In various embodiments, the ring structure is provided with intersections or slots, to assure good producibility. The slots may additionally be effective for reducing the stress inside the tab to a minimum. In particular embodiments, the ring structure may be provided with a chamfer to allow stacking. The raised ring structure additionally provides an advantageous mechanism for aligning a clip to the tab, thus allowing convenient electrical connection to an external component, such as a substrate or additional semiconductor chip.

Turning to FIG. 1A-1F there are shown various views of a tab structure and connector according to embodiments of the present disclosure. In FIG. 1A, there is shown a perspective view of a tab 100. The tab 100 includes an outer portion 102, having a planar shape, where a lower surface (not visible) is adapted to contact a surface of planar structure, such as a semiconductor die. In various non-limiting embodiments, the tab 100 may be made of Cu or Cu alloy, molybdenum or Cu/Fe alloy/Cu sandwich systems. The tab 100 may additionally include a surface layer or finish, such as Ni, according to some embodiments. With reference also to the Cartesian coordinate system shown in FIG. 1F (as well as FIG. 1E), the upper surface 105 of the tab 100 may define a main plane of the tab 100 that lies parallel to the X-Y plane shown. Turning also to FIG. 1F, the outer portion 102 may have width W and length L that are designed according to a substrate, such as a semiconductor chip, to be contacted. As shown in the side cross-sectional view of FIG. 1E, the outer portion 102 may be designed to adjoin a contact region 152 of a substrate 150 (e.g., semiconductor chip), where the contact region 152 may represent a main contact, such as a cathode in the example of an SCR. As such, the dimensions of W and L may cover a larger portion of the contact region 152, and may be in the range of 3 mm to 30 mm according to some non-limiting embodiments.

The tab 100 further may include a ring portion 104, where the ring portion 104 is connected to the outer portion 102. The ring portion extends proud of the main plane of the tab 100, meaning above the plane of the outer portion 102, along the Z-direction. The ring portion 104 defines a inner hole 107 within the tab 100, as also depicted in the close up view of FIG. 1B. This inner hole 107 may be used to expose a contact region 154 of a surface of a semiconductor die, meaning substrate 150, as shown in FIG. 1E, discussed further below. In some non-limiting embodiments, the inner hole 107 may have an inner diameter ID of at least two millimeters, as viewed in a top plan view, such as in FIG. 1F. This inner hole 107 may accommodate a connection to be made to the contact region 154, which portion may be a gate contact that is isolated from the contact region 152. As further illustrated in FIG. 1B and FIG. 1E, a lower part 108 of the ring portion 104 that is adjacent to the outer portion 102 is curved. As such, the ring portion 104 may have a lower diameter LD that is larger than the value of the outer diameter OD at top of the ring portion. The value of OD may be just larger than the value of the inner hole 107 diameter ID, allowing for the thickness of the wall of the ring portion 104, which thickness may be on the order of 0.25 mm to 0.5 mm in some non-limiting embodiments. In some non-limiting embodiments, the value of the outer diameter may be at least 4 mm, at least 5 mm, at least 6 mm.

Turning now to FIG. 1C and FIG. 1D in particular, there is shown a perspective view and close up view, respectively, of a connector 110, including the tab 100 and a clip 112. The clip 112 may be bent is some embodiments, and may include a connection portion 114 that has an aperture 116 that is adapted to couple around the ring portion 104. In various embodiments the ring portion 104 may extend at least 0.5 mm, at least 1.0 mm, or at least 1.5 mm above the main plane of the outer portion 102 as defined by the upper surface 105.

According to various embodiments, the ring portion 104 may include at least two slots, shown as slots 106. In the particular embodiment illustrated in FIGS. 1A-1F, the ring portion 104 includes four slots that are symmetrically distributed around the ring portion 104. In other embodiments a ring portion may include more than four slots, may include two slots, or need not include any slots. The slots 106 may serve to reduce the stress within the tab 100 to a minimum. As an example, thermal mismatch stress may tend to develop between the tab 100 and an underlying semiconductor substrate, when the two are bonded together, and under conditions where the two are heated or cooled, due to the difference in thermal expansion coefficients between a metallic material of the tab and the silicon or other semiconductor material of the semiconductor substrate.

With reference also to FIG. 5A and FIG. 5B, in operation the connector 110 may connect a semiconductor chip, shown as semiconductor chip 502, to another component, such as a DCB substrate, represented by substrate 504. As known, the substrate 504 may include a ceramic body that includes a copper layer on each main surface. In the perspective view of FIG. 5A, the connector 110 may connect a main terminal on the surface of semiconductor chip 502 to a metallized surface of the substrate 504. As such, the connector 110 may be designed to provide good thermal and electrical connection between the semiconductor chip 502 and the substrate 504. The external electrical connection to a gate terminal inside the inner hole 107 is omitted for clarity. As shown in the side cross-sectional view of FIG. 5B, the semiconductor chip 502, substrate 504 and connector 110 may form part of a semiconductor device module, shown as module 510, where the module 510 may include a filler material. The presence of the ring portion 104 may accordingly tend to preclude interaction of filler material with a gate contact that lies within inner hole 107.

FIG. 1G-1L illustrate various views of another tab 120 and connector 130 according to embodiments of the present disclosure. In this example, the tab 120 is similar to the tab 100, with like elements labeled the same. The views of FIG. 1G, FIG. 1H, FIG. 1I, FIG. 1J, FIG. 1K, and FIG. 1L correspond to the views of FIG. 1A, FIG. 1B, FIG. 1C, FIG. 1D, FIG. 1E, and FIG. 1F, respectively. A difference is that an outer portion 102B of the tab 120 includes additional features, shown as slots 109 and holes 111, which features may reduce thermo-mechanical stress.

These features serve to divide the tab 120 into effectively smaller regions, with respect to the overall length of the side of the tab 120. For example, in the instance where a pure metal tab of Cu is used as tab 120, and is connected and in contact with a silicon die (not shown), the expansion of Cu exceeds that of Si. Introducing holes or slots ensures that, during change of ambient temperatures, the tab 120 can expand at a rate commensurate with the rate of the Si die. In addition, in the views of FIGS. 1I, 1J, 1K, and 1L there may be provided four protrusion, shown as protrusions 115, close to the four holes of holes 111, respectively. The function of these protrusions 115 is to form a uniform bond (solder) line thickness, with a typical height of 50-100 μm. Otherwise, the connector 130 is similar to the connector 110.

Turning to FIG. 2A-2D there are shown various views of a tab structure and connector according to other embodiments of the present disclosure. In this example, a tab 200 is provided along with a connector 210, where these components may be similar to tab 100 and connector 110, with like parts labeled the same. A difference is that the tab 200 includes a ring portion 204 that includes two slots, shown again as slots 106.

In other embodiments, a connector and tab structure may include a ring portion that is chamfered. In particular, the ring portion may have a chamfered shape as viewed in a plane extending perpendicularly from the main plane of the tab, such as the Y-Z plane or X-Z plane. In various embodiments, the value of the angle of the side of the ring portion that forms a chamfered shape may be greater than 0 degrees and less than 90 degrees with respect to the X-Y plane, and in one example may be equal to 60 degrees.

Figure 2D:
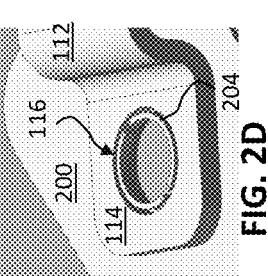
FIG. 2A-2D depict various views of a further tab structure and connector according to other embodiments of the present disclosure.
Figure 2H:
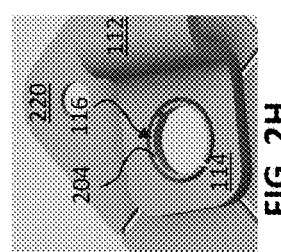
FIG. 2E-2H depict various views of an additional tab structure and connector according to other embodiments of the present disclosure.
Figure 2C:
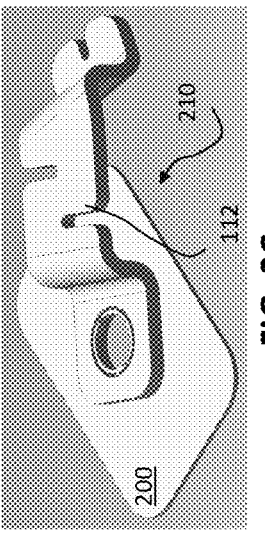
Figure 2G:
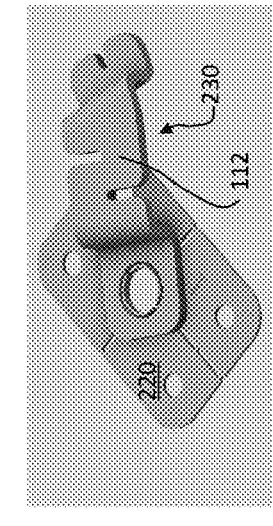
Figure 2B:
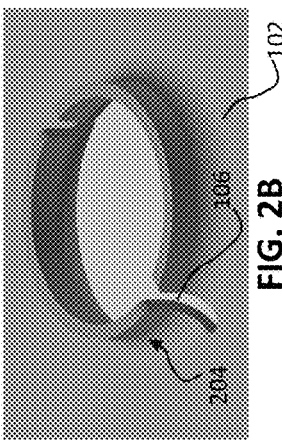
Figure 2F:
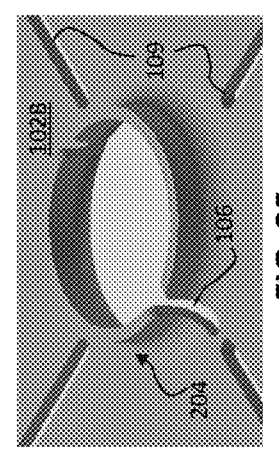
Figure 2A:
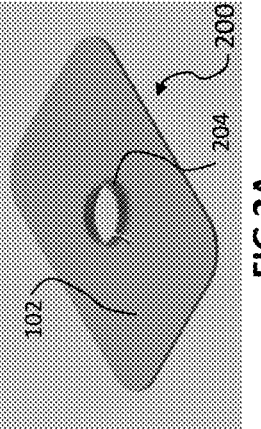
Figure 2E:
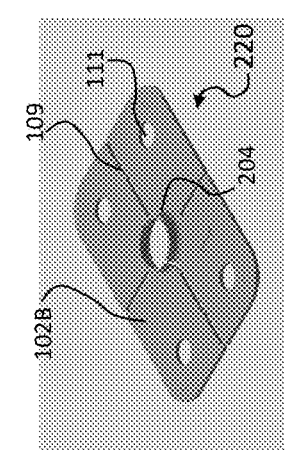

FIG. 2E-1H illustrate various views of another tab structure and connector according to embodiments of the present disclosure. In this example, the tab 220 is similar to the tab 200, with like elements labeled the same. The views of FIG. 2E, FIG. 2F, FIG. 2G, and FIG. 2H, correspond to the views of FIG. 2A, FIG. 2B, FIG. 2C, FIG. 2D, respectively. A difference is that an outer portion 102B of the tab 220 includes additional features, shown as slots 109 and holes 111, discussed previously. Otherwise, the connector 230 is similar to the connector 210.

Figures 3A, 3B, 3C, 3D, 3E, 3F, 3G, 3H:
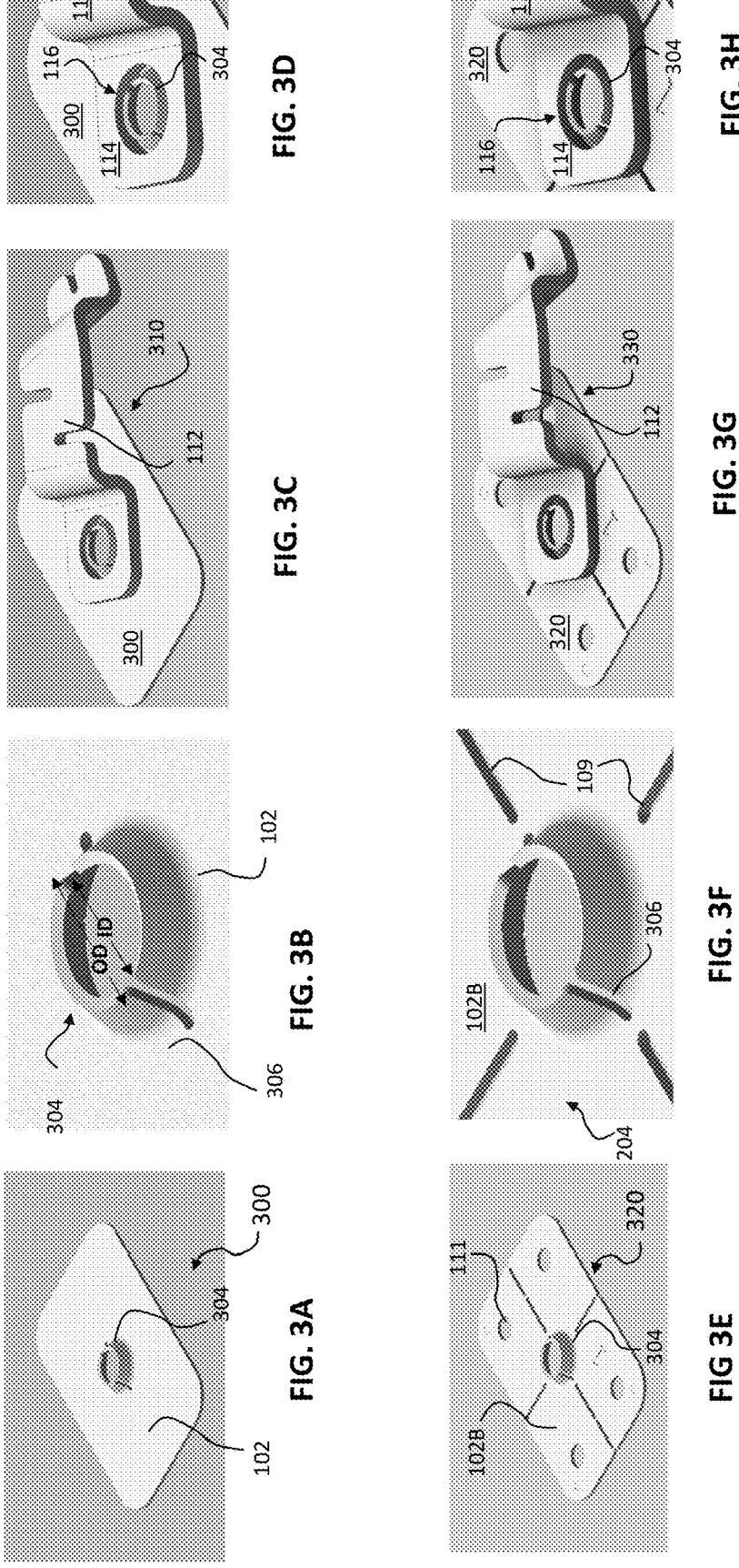
FIG. 3A-3D shows various views of a tab structure and connector according to additional embodiments of the present disclosure.
FIG. 3E-3H shows various views of another tab structure and connector according to additional embodiments of the present disclosure.

Turning to FIG. 3A-3D there are shown various views of a tab structure and connector according to embodiments of the present disclosure. In FIG. 3A, there is shown a perspective view of a tab 300. The tab 300 and connector 310 may be similar to tab 200 and connector 210, where like features are labeled the same. A difference is that a ring portion 304 is provided that is chamfered. The two slots, shown as slots 306 also follow the chamfer shape of the ring portion 304. The use of a chamfer structure may aid in alignment with the clip 112, for example, as shown in FIG. 3D.

FIG. 3E-3H illustrate various views of a further tab structure and connector according to embodiments of the present disclosure. In this example, the tab 320 is similar to the tab 300, with like elements labeled the same. The views of FIG. 3E, FIG. 3F, FIG. 3G, and FIG. 3H, correspond to the views of FIG. 3A, FIG. 3B, FIG. 3C, FIG. 3D, respectively. A difference is that an outer portion 102B of the tab 320 includes additional features, shown as slots 109 and holes 111, discussed previously. Otherwise, the connector 330 is similar to the connector 310.

Figure 4D:
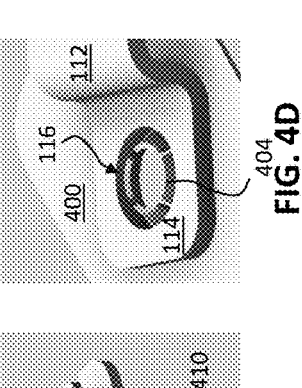
FIG. 4A-4F show various views of a tab structure and connector according to further embodiments of the present disclosure.
Figure 4C:
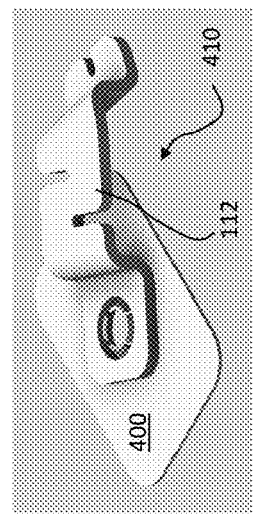
Figure 4F:
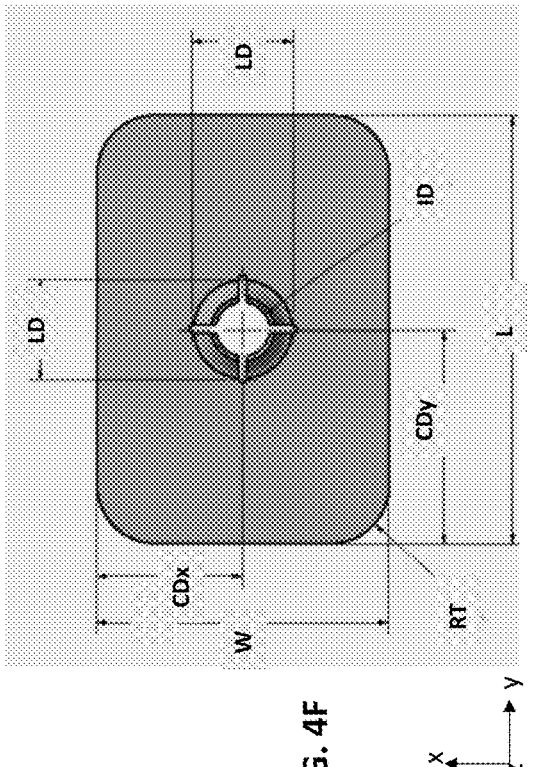
Figure 4B:
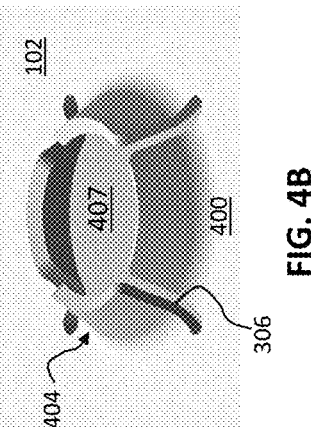
Figure 4A:
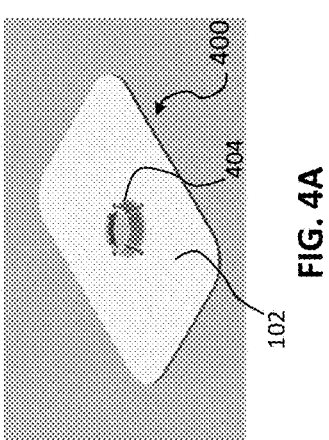
Figure 4E:
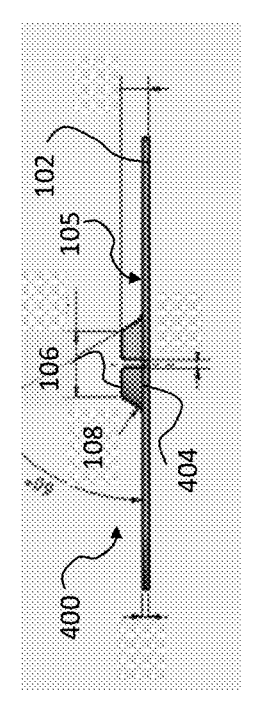
Figure 4E:
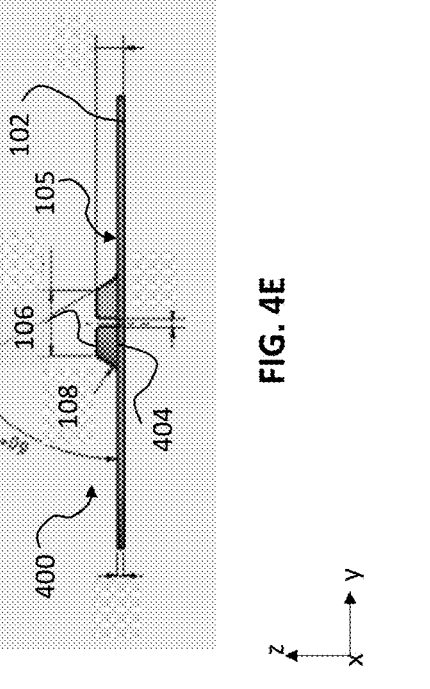
Figures 4G, 4H, 4I, 4J, 4K, 4L:
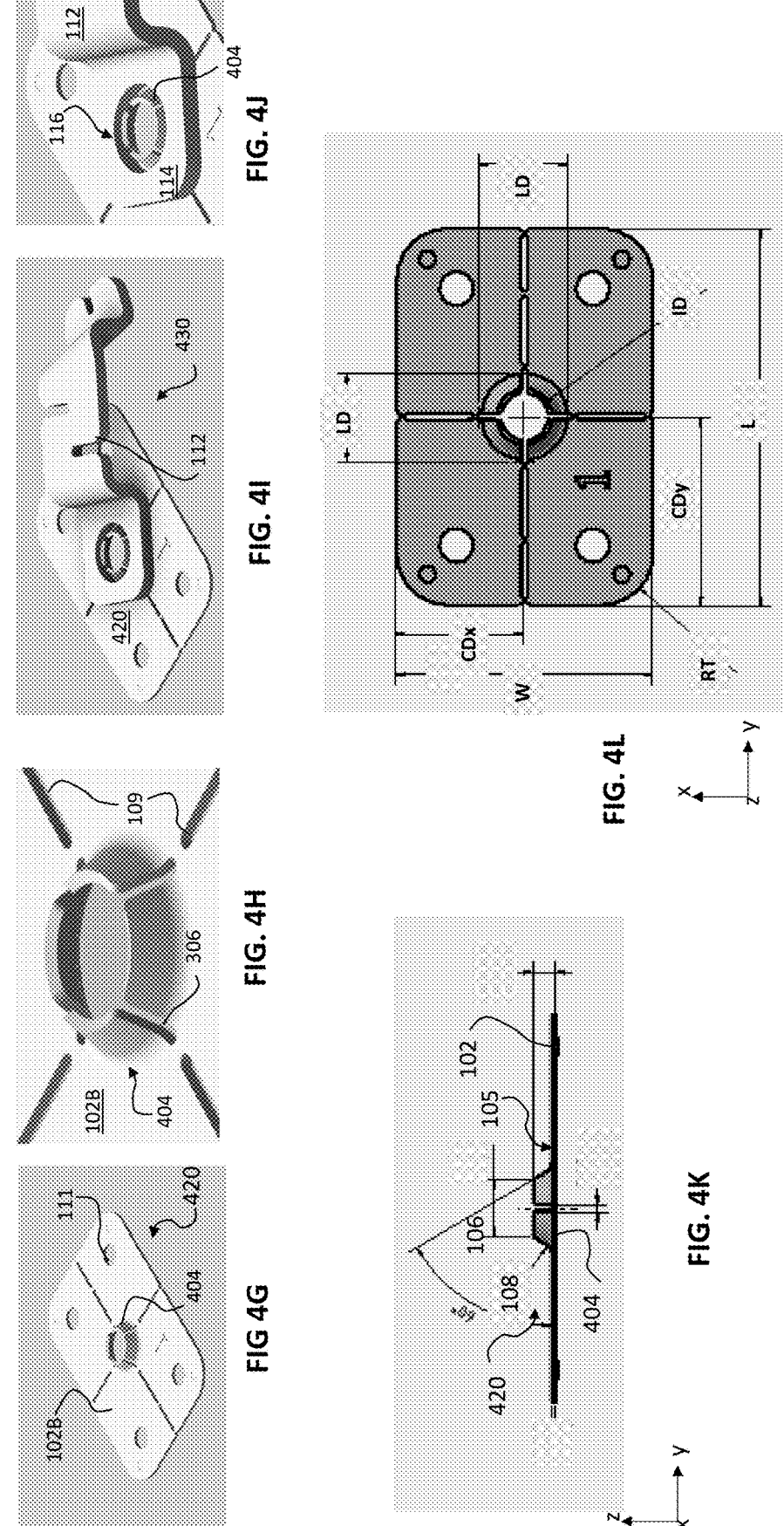
FIG. 4G-4L show various views of an additional tab structure and connector according to further embodiments of the present disclosure.

Turning to FIG. 4A-4F there are shown various views of a tab structure and connector according to embodiments of the present disclosure. In FIG. 4A, there is shown a perspective view of a tab 400. The tab 400 and connector 410 may be similar to tab 300 and connector 310, where like features are labeled the same. A difference is that a ring portion 404 includes four slots, shown as slots 306. As shown in FIG. 4F, the dimensions of the inner hole 407, as represented by ID, may be substantially smaller than the lower diameter LD, due to the chamfering.

FIG. 4G-4L illustrate various views of another tab structure and connector according to additional embodiments of the present disclosure. In this example, the tab 420 is similar to the tab 400, with like elements labeled the same. The views of FIG. 4G, FIG. 4H, FIG. 4I, FIG. 4J, FIG. 4K, and FIG. 4L correspond to the views of FIG. 4A, FIG. 4B, FIG. 4C, FIG. 4D, FIG. 4E, and FIG. 4F, respectively. A difference is that an outer portion 102B of the tab 120 includes additional features, shown as slots 109 and holes 111, discussed previously. Otherwise, the connector 430 is similar to the connector 410.

FIG. 6 depicts a process flow 600, according to embodiments of the disclosure.

At block 602, a tab for connection between a semiconductor die (semiconductor chip) and an external component is provided. The tab may have a ring structure, where the tab includes an outer portion that is generally flat, and includes a ring portion that extends proud of a main surface of the outer portion. As an example, the upper surface of the outer portion may be a planar surface, while the ring portion is located in a middle or central region of the tab, so that the outer portion surrounds the ring portion. In some embodiments, the ring portion may include a plurality of slots, such as two slots, four slots, and so forth. These slots may be positioned symmetrically around the ring portion for example. Thus, a ring portion having two slots may place the slots 180 degrees separate from one another, while a ring portion having four slots may place the slots 90 degrees from one another. In some embodiments, the ring portion may have a chamfered shape.

At block 604, a clip is provided, where the clip includes an aperture on a connection surface. The connection surface may have a planar shape and may generally be smaller than the size of the outer portion of the tab.

At block 606, the clip is assembled to the tab to form a connector. In particular, the connection surface may be moved toward the upper surface of the outer portion of the tab, such that the aperture of the connection surface of the clip is aligned over the ring portion of the tab. The connection of the clip and the tab may be completed using procedures such as sintering or soldering.

At block 608, a connection surface of the connector is bonded to a semiconductor substrate. For example, the tab may be placed on a surface of a semiconductor substrate (semiconductor chip), where the outer portion of the tab is aligned over a main electrode contact region, such as a cathode contact region of an SCR. At the same time, the ring portion of the tab may be aligned over a gate contact region on the surface of the semiconductor substrate.

At block 610, an electrical connection is made to a contact region at the surface of the semiconductor substrate that lies within the hole defined by the ring portion of the tab. The contact region may represent a gate contact, for example. The electrical connection may be established by wire bonding, for example.

At block 612, a second connection part of the clip is connected to an external component such as another semiconductor die or a DBC substrate or DBA substrate.

In summary, the present embodiments, by providing novel metal tab configurations, facilitate easier assembly of a connector structure, such as a clip and tab combination, where the clip aperture is more readily aligned with the tab by providing a ring portion that extends above the main surface of the tab. The present embodiments further prevent filler material from coming into contact with a gate of a semiconductor device that is otherwise exposed in the opening under the ring portion.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A connector for contacting a semiconductor chip, comprising:
   a tab, comprising:
      an outer portion, having a planar shape, the outer portion having a lower surface, adapted to contact a surface of the semiconductor chip, and an upper surface that defines a main plane of the tab; and
      a ring portion, the ring portion connected to the outer portion and extending proud of the main plane, wherein the ring portion defines an inner hole within the tab, the inner hole being adapted to expose a contact portion of the surface of the semiconductor chip, wherein the ring portion includes at least two slots; and
   a clip, comprising a connection portion, the connection portion having an aperture that is adapted to couple around the ring portion.

2. The connector of claim 1, wherein the ring portion extends at least 0.5 mm above the main plane.

3. The connector of claim 1, wherein the inner hole has a diameter of at least two millimeters.

4. The connector of claim 1, wherein the ring portion comprises an outer diameter of at least four millimeters.

5. The connector of claim 1, wherein the ring portion has a chamfered shape in a plane extending perpendicularly to the main plane.

6. The connector of claim 1, wherein a lower part of the ring portion that is adjacent to the outer portion is curved.

7. The connector of claim 1, wherein the at least two slots are arranged symmetrically around the ring portion.

8. The connector of claim 1, wherein the at least two slots comprise four slots.

9. A semiconductor device module, comprising
   a housing, comprising a filler material;
   a substrate, comprising an insulating material, disposed within the housing;
   a semiconductor chip, disposed within the housing and disposed on the substrate, the semiconductor chip having an upper surface; and
   a connector, affixed to the semiconductor chip, wherein the connector comprises:
   a tab, comprising:
      an outer portion, having a planar shape, the outer portion having a lower surface, affixed in contact with the upper surface of the semiconductor chip, the outer portion having an upper surface that defines a main plane of the tab structure; and
      a ring portion, the ring portion connected to the outer portion and extending proud of the main plane, wherein the ring portion defines an inner hole within the tab, wherein a contact portion of the surface of the semiconductor chip is exposed within the inner hole, wherein the ring portion includes at least two slots; and
   a clip, comprising a connection portion, the connection portion having an aperture that is affixed around the ring portion.

10. The semiconductor device module of claim 9, wherein the ring portion extends at least 0.5 mm above the main plane.

11. The semiconductor device module of claim 9, wherein the inner hole has a diameter of at least two millimeters.

12. The semiconductor device module of claim 9, wherein the ring portion comprises an outer diameter of at least four millimeters.

13. The semiconductor device module of claim 9, wherein the ring portion has a chamfered shape in a plane extending perpendicularly to the main plane.

14. The semiconductor device module of claim 9, wherein a lower part of the ring portion that is adjacent to the outer portion is curved.

15. The semiconductor device module of claim 9, wherein the at least two slots are arranged symmetrically around the ring portion.

16. The semiconductor device module of claim 9, wherein the at least two slots comprise four slots.

* * * * *